US009722064B2

(12) United States Patent
Cheng

(10) Patent No.: US 9,722,064 B2
(45) Date of Patent: Aug. 1, 2017

(54) ISOLATED GATE FIELD EFFECT TRANSISTOR AND MANUFACTURE METHOD THEREOF

(71) Applicant: Dynax Semiconductor, Inc., Jiangsu (CN)

(72) Inventor: Kai Cheng, Jiangsu (CN)

(73) Assignee: Dynax Semiconductor, Inc., Jiangsu (CN)

( * ) Notice: Subject to any disclaimer, the term of this patent is extended or adjusted under 35 U.S.C. 154(b) by 0 days.

(21) Appl. No.: 14/402,525

(22) PCT Filed: May 21, 2013

(86) PCT No.: PCT/CN2013/075976
§ 371 (c)(1),
(2) Date: Nov. 20, 2014

(87) PCT Pub. No.: WO2013/178027
PCT Pub. Date: Dec. 5, 2013

(65) Prior Publication Data
US 2015/0144955 A1    May 28, 2015

(30) Foreign Application Priority Data
May 30, 2012  (CN) .......................... 2012 1 0173384

(51) Int. Cl.
*H01L 29/778* (2006.01)
*H01L 29/423* (2006.01)
(Continued)

(52) U.S. Cl.
CPC ...... *H01L 29/7787* (2013.01); *H01L 21/0223* (2013.01); *H01L 21/31111* (2013.01);
(Continued)

(58) Field of Classification Search
CPC .......... H01L 29/42316; H01L 29/4236; H01L 29/66462; H01L 29/7783
(Continued)

(56) References Cited

U.S. PATENT DOCUMENTS 7,859,021 B2    12/2010  Kaneko
2007/0267655 A1*  11/2007  Endoh ............... H01L 29/66462
                                                        257/194
(Continued)

FOREIGN PATENT DOCUMENTS

CN          1264158        8/2000
CN          101410985      4/2009
(Continued)

OTHER PUBLICATIONS

International Search Report dated Aug. 29, 2013; International Application No. PCT/CN2013/075976; International Filing Date: May 21, 2013; 5 pages.
(Continued)

*Primary Examiner* — Kimberly Rizkallah
*Assistant Examiner* — Brian Turner
(74) *Attorney, Agent, or Firm* — Blank Rome LLP

(57) ABSTRACT

An isolated gate field effect transistor and the manufacture method thereof. The isolated gate field effect transistor includes a substrate; a nitride transistor structure arranged on the substrate; a dielectric layer on the nitride transistor structure, where the dielectric layer includes a first dielectric layer, a second dielectric layer and a third dielectric layer and material of the second dielectric layer includes metal; a groove formed in a gate region and at least partially through the dielectric layer; a metal gate formed in the groove; and a source electrode and a drain electrode located at two ohmic contact regions.

13 Claims, 20 Drawing Sheets

(51) Int. Cl.

| | | |
|---|---|---|
| *H01L 29/739* | (2006.01) | |
| *H01L 29/40* | (2006.01) | |
| *H01L 29/51* | (2006.01) | |
| *H01L 29/66* | (2006.01) | |
| *H01L 29/20* | (2006.01) | |
| *H01L 21/02* | (2006.01) | |
| *H01L 21/311* | (2006.01) | |
| *H01L 29/201* | (2006.01) | |
| *H01L 29/205* | (2006.01) | |

(52) U.S. Cl.
CPC ...... *H01L 21/31116* (2013.01); *H01L 29/201* (2013.01); *H01L 29/2003* (2013.01); *H01L 29/205* (2013.01); *H01L 29/402* (2013.01); *H01L 29/42364* (2013.01); *H01L 29/513* (2013.01); *H01L 29/517* (2013.01); *H01L 29/518* (2013.01); *H01L 29/66462* (2013.01); *H01L 29/7783* (2013.01); *H01L 29/7786* (2013.01)

(58) Field of Classification Search
USPC .... 257/192, 66, 194, 76, E21.159, E29.068; 438/675
See application file for complete search history.

(56) References Cited

U.S. PATENT DOCUMENTS

| | | | | |
|---|---|---|---|---|
| 2010/0289067 A1* | 11/2010 | Mishra | ................ | H01L 29/2003 257/268 |
| 2011/0089468 A1 | 4/2011 | Zhang | | |
| 2011/0147710 A1* | 6/2011 | Dewey | ................ | H01L 29/513 257/24 |
| 2012/0049156 A1* | 3/2012 | Ohta | ................ | H01L 21/0237 257/13 |
| 2012/0161287 A1* | 6/2012 | Iza | ........................ | C30B 23/025 257/613 |
| 2012/0223320 A1* | 9/2012 | Dora | ................ | H01L 29/1608 257/76 |
| 2012/0319169 A1* | 12/2012 | Van Hove | ............. | H01L 23/291 257/194 |
| 2013/0292698 A1* | 11/2013 | Then | ................ | H01L 29/4236 257/76 |
| 2014/0239309 A1* | 8/2014 | Ramdani | .......... | H01L 29/66462 257/76 |

FOREIGN PATENT DOCUMENTS

| | | |
|---|---|---|
| CN | 101604704 | 12/2009 |
| CN | 201820759 | 5/2011 |
| CN | 102723358 | 10/2012 |

OTHER PUBLICATIONS

Translation of International Search Report dated Aug. 29, 2013; International Application No. PCT/CN2013/075976; International Filing Date: May 21, 2013; 3 pages.
Translation of China Application No. CN101604704; 15 pages.
Translation of China Application No. CN102723358; 23 pages.
Translation of China Application No. CN101410985; 24 pages.
Translation of China Application No. CN1264158; 12 pages.
Translation of China Application No. CN201820759; 12 pages.

* cited by examiner

ISOLATED GATE FIELD EFFECT TRANSISTOR AND MANUFACTURE METHOD THEREOF

This application is a U.S. national phase application of PCT International Application PCT/CN2013/075976, filed May 21, 2013; which application claims priority to Chinese Patent Application No. 201210173384.8, entitled "ISOLATED GATE FIELD EFFECT TRANSISTOR AND MANUFACTURE METHOD THEREOF", filed with the Chinese State Intellectual Property Office on May 30, 2012. Each of the above-identified applications are incorporated herein by reference in their entirety.

FIELD

The present application relates to the field of microelectronic technology, and particularly to an insulating gate field effect transistor, and a method for fabricating the insulating gate field effect transistor.

BACKGROUND

Group III nitride semiconductors are suitable for making high-temperature, high conversion speed and high power electronic devices due to properties such as wide band gap, high dielectric breakdown electric field and high electron saturated drift velocity. In a GaN-based field effect transistor, a large amount of charges are generated in a channel layer by piezoelectric polarization and spontaneous polarization. Since two-dimensional electron gas is formed by ionization of donor-type surface states of a surface of nitride, a current density of a nitride transistor is sensitive to the surface states, and a current collapse effect is prone to occur. In addition, during epitaxial growth of a GaN-based electronic device, there are many defects on a material surface because of lattice mismatch and thus tensile stress introduced into AlGaN by a GaN buffer layer. These surface defects may also affect on performance of the device, such as causing a current collapse effect and causing problems in reliability of the device. GaN-based field effect transistors may be divided into two categories, i.e., Schottky gate field effect transistors and insulating gate field effect transistors, from a view of gate structure. A gate with a Schottky contact is easy to be fabricated and has an easily-controlled surface, which are ideal for a radio frequency device. However, the gate with the Schottky contact has no dielectric layer for separation, and therefore a leakage current of the gate is high. In addition, due to limitation of forward conduction of the Schottky contact, a bias voltage on the gate should not be greater than 2V, and a bias voltage greater than 2V will cause the gate to lose an ability of controlling the channel. For an insulating gate, a dielectric layer, such as silicon dioxide, aluminum oxide, hafnium oxide, silicon nitride and silicon oxynitride, is usually arranged below gate metal, and thus the leakage current of the gate is low, which is suitable for power devices.

There are generally three structures for conventional nitride transistors, as shown in FIGS. 1a, 1b and 1c. In fabrication of a gallium nitride transistor as shown in FIG. 1a, a surface of nitride is exposed by etching a dielectric layer 6 in a gate region, to form a gate 11 with a Schottky contact. A disadvantage of this method is that the surface of the nitride is prone to be damaged during dry etching, which increases the surface states and thus degrades performance of the device. In addition, the Schottky contact brings a high reverse leakage current, which causes problems in reliability of the device. In order to reduce the leakage current of the gate, an insulating layer may be deposited at the gate region after etching away a silicon nitride passivation layer in the gate region, the insulating dielectric layer may be deposited with a device such as ALD for example, as shown in FIG. 1b. However, during the etching and the deposition of the dielectric layer 6, the surface of the nitride transistor 1 will be damaged, in addition, the surface of the nitride transistor 1 will be contaminated to some extent before depositing the ALD dielectric layer. All these factors will increase the surface states and degrade performance of the device. Interface state between the ALD dielectric layer and the nitride is also a major unsolved problem which may cause a severe current collapse effect. Another structure can also be used to achieve an insulating gate nitride field effect transistor, as shown in FIG. 1c. In etching the dielectric layer at the gate region, a part of the dielectric layer 6 under the gate may be retained by controlling etching speed and etching time. However, due to repetition of the etching process, a thickness of the retained dielectric layer can not be accurately controlled, thereby causing a drift of a threshold voltage.

SUMMARY

The application is to provide an insulating gate field effect transistor structure, and a method for fabricating the same. A multilayered composite dielectric layer is grown on the nitride transistor structure, and metal is introduced into an intermediate layer of the composite dielectric layer, where etching speed of the dielectric layer containing the metal is much lower than etching speed of the dielectric not containing metal. In etching a gate groove in a gate region, due to the great difference in etching speed, it is easy to stop etching process on the intermediate dielectric layer containing the metal after the top layer of the composite dielectric is etched away. Therefore, a depth of the etched gate groove can be accurately controlled. Since the surface of the nitride transistor is always covered and protected by the remaining bottom layer of the composite dielectric layer, damages to the surface of the nitride in the ion etching are avoided. In addition, the remaining dielectric layer also prevents the surface of the transistor from other contaminations. Therefore, stress relaxation and contaminations to the surface of the nitride are avoided, and the current collapse effect of the device is greatly reduced. With the structure and the method of the application, the surface of the device is protected in the process, and the depth of the etched gate groove is accurately controlled and thus a threshold voltage of the device is stabilized.

To achieve the above purpose, the application discloses an insulating gate field effect transistor, including:

a substrate;

a nitride transistor structure arranged on the substrate;

a dielectric layer on the nitride transistor structure, where the dielectric layer includes a first dielectric layer on the nitride transistor structure, a second dielectric layer on the first dielectric layer, and a third dielectric layer on the second dielectric layer, where material of the second dielectric layer includes metal, a gate region and two ohmic contact regions respectively located at two sides of the gate region are defined on the dielectric layer, and each of the two ohmic contact regions is through the dielectric layer;

a groove formed in the gate region and at least partially through the dielectric layer;

a metal gate formed in the groove; and a source electrode and a drain electrode located at the two ohmic contact regions.

Preferably, in the above insulating gate field effect transistor, the nitride transistor structure includes:

a nitride nucleation layer located on the substrate;

a nitride buffer layer located on the nitride nucleation layer;

a nitride channel layer located on the nitride buffer layer; and a nitride barrier layer located on the nitride channel layer.

Preferably, in the above insulating gate field effect transistor, the nitride nucleation layer is AlInGaN, the nitride buffer layer is AlGaN, the nitride channel layer is GaN, and the nitride barrier layer is AlInGaN.

Preferably, in the above insulating gate field effect transistor, the first dielectric layer is selected from one or any combination of silicon nitride, aluminum nitride, silicon oxynitride, silicon aluminum nitride, aluminum oxynitride, hafnium oxide, aluminum hafnium oxide, titanium oxide and nickel oxide.

Preferably, in the above insulating gate field effect transistor, the metal in the second dielectric layer is selected from one or any combination of aluminum, nickel, titanium and magnesium.

Preferably, in the above insulating gate field effect transistor, the second dielectric layer is selected from aluminum nitride, silicon aluminum nitride, aluminum oxide, aluminum oxynitride, magnesium nitride, silicon magnesium nitride, magnesium oxide, magnesium oxynitride, magnesium aluminum nitride, silicon magnesium aluminum nitride or magnesium aluminum oxide.

Preferably, in the above insulating gate field effect transistor, the third dielectric layer is selected from silicon nitride, silicon dioxide, silicon aluminum nitride or silicon oxynitride.

Preferably, in the above insulating gate field effect transistor, the metal gate further includes a field plate structure.

Preferably, in the above insulating gate field effect transistor, an additional dielectric layer is further deposited on an inner wall of the groove, and the metal gate is formed on the additional dielectric layer, where material of the additional dielectric layer is selected from one or any combination of $Al_2O_3$, AlON, SiN, SiON, $SiO_2$, HfAlO, $TiO_2$, NiO, $HfO_2$, AlN and SiAlN.

Preferably, in the above insulating gate field effect transistor, the first dielectric layer has a thickness of 0.25-50 nm, the second dielectric layer has a thickness of 0.25-50 nm, and the third dielectric layer has a thickness of 1-300 nm, The application further discloses a method for fabricating an insulating gate field effect transistor, including steps as follows:

providing a substrate, and forming a nitride transistor structure on the substrate;

growing a first dielectric layer, a second dielectric layer and a third dielectric layer on the formed nitride transistor structure, where material of the second dielectric layer includes metal, and a gate region is defined on the third dielectric layer;

forming, in the gate region, a groove extending toward the nitride transistor structure, where the groove is through at least the third dielectric layer;

forming a metal gate in the groove;

etching the dielectric layer at two sides of the gate region, to form two ohmic contact regions; and forming a source electrode and a drain electrode at the two ohmic contact regions, respectively.

Preferably, in the above method for fabricating the insulating gate field effect transistor, forming the groove includes etching the third dielectric layer with fluorine-based plasmas.

Preferably, in the above method for fabricating the insulating gate field effect transistor, forming the groove further includes etching the second dielectric layer with wet etching based on KOH or dry etching based on chloridions.

Preferably, the above method for fabricating the insulating gate field effect transistor further includes performing oxidation treatment on the second dielectric layer corresponding to a bottom of the groove before forming the metal gate in the groove.

Preferably, in the above method for fabricating the insulating gate field effect transistor, the oxidized second dielectric layer and the first dielectric layer compose a composite dielectric layer, to form an insulating gate structure.

Compared with the conventional technology, a dielectric layer is formed on the nitride transistor structure, metal is introduced into the dielectric layer, a groove structure is formed in a gate region by controlling etching speed and etching depth and then a metal gate is arranged in the groove in this application, therefore, air contaminations to the surface of the nitride or damages to the surface of the nitride in the processes are avoided. The dielectric layer is made of material such as SiN, which has high thermal stability, therefore, the surface of the nitride transistor can be stabilized, and defects and density of the surface state are reduced. Thus, electrical properties and surface quality of the insulating gate field effect transistor of the application and structure quality of the nitride transistor are greatly improved. For example, the current collapse effect is restrained.

BRIEF DESCRIPTION OF THE DRAWINGS

For clarity of description of solutions in embodiments of the application or conventional solutions, drawings for description of the embodiments and the conventional technology are briefly described below. Obviously, the drawings described below are merely a few embodiments of the application. Other drawings may be obtained by those skilled in the art according to these drawings without paying any creative work.

DETAILED DESCRIPTION

Figure 1A:
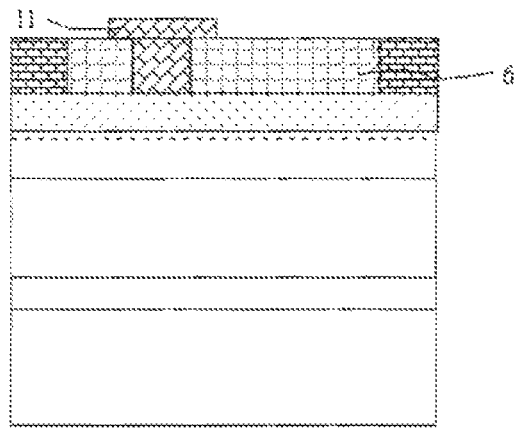
FIG. 1a-FIG. 1c are schematic structural diagrams of a nitride transistor in the conventional technology.
Figure 1B:
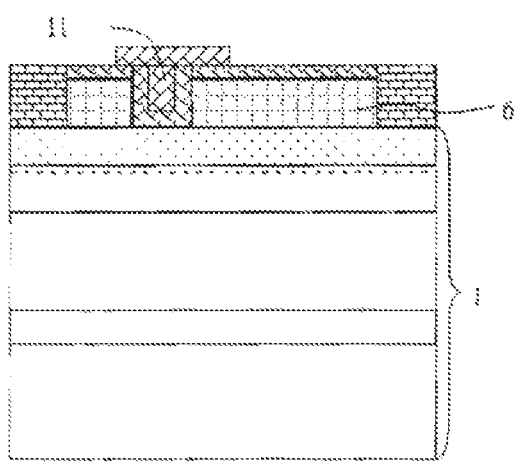
Figure 1C:
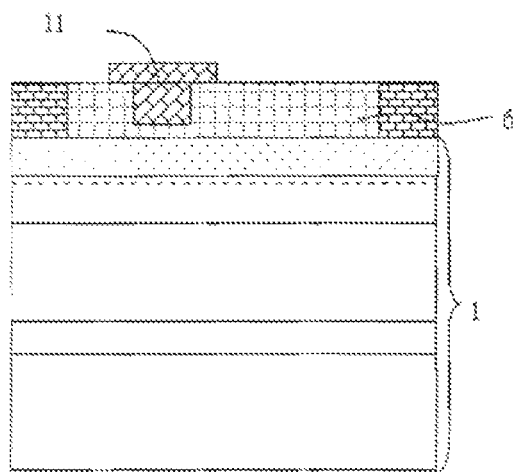

The application is described below in detail with the embodiments shown in the drawings. However, the embodiments are not to limit the application. Modifications in structure, manner or function made by those skilled in the art according to the embodiments are within the protection scope of the application.

In addition, a same numeral or sign may be used in different embodiments. The reuse is merely for simplicity and clarity of description of the application, but indicates no relevancy among the various embodiments and/or structures.

Figure 2A:
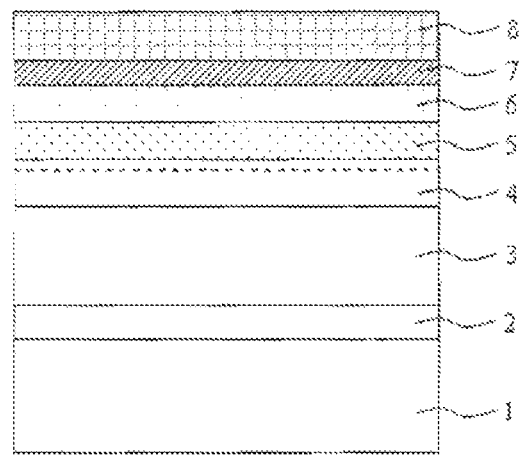
FIG. 2a-FIG. 2e are cross sections illustrating an insulating gate field effect transistor and a series of processes of a method for fabricating the same according to a first embodiment of the application.
Figure 2B:
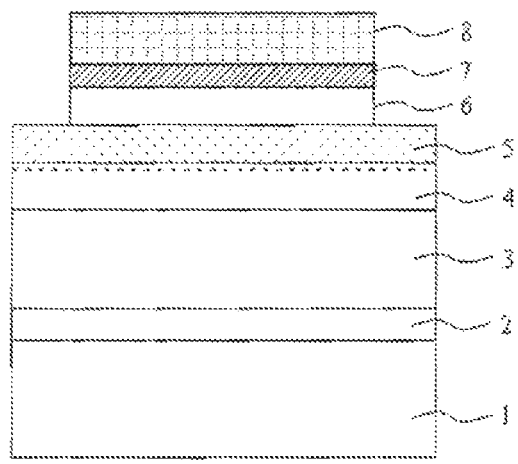
Figure 2C:
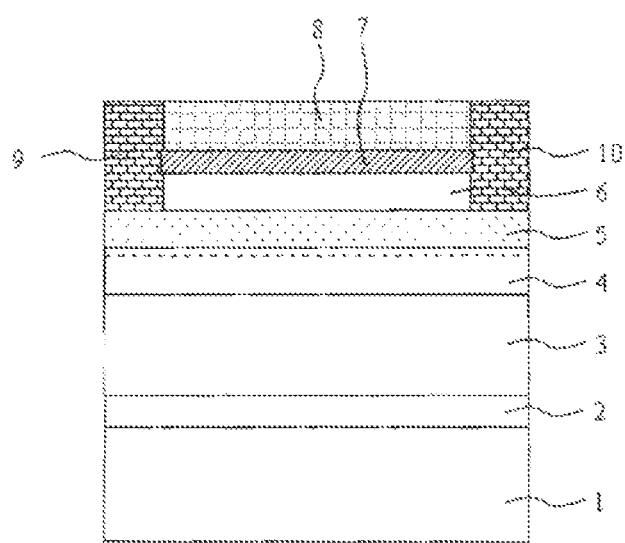

Referring to FIG. 2c, in a first embodiment of the application, an insulating gate field effect transistor includes: a substrate 1, and a nitride nucleation layer 2, a nitride buffer layer 3, a nitride channel layer 4, a nitride barrier layer 5, a silicon nitride layer 6 (a first dielectric layer), a silicon aluminum nitride layer 7 (a second dielectric layer) and a silicon nitride layer 8 (a third dielectric layer) which are formed on the substrate 1 in sequence. A groove H1 is arranged in a gate region of the silicon nitride layer H (referring to FIG. 1d). A height of the groove H1 is equal to a thickness of the silicon nitride layer 8. A metal gate 11 is formed in the groove H1. Insulating gate dielectric below the metal gate 11 is composed of the silicon nitride layer 6 and the silicon aluminum nitride layer 7. The metal gate 11 has a field plate structure 111. A source electrode 9 and a drain electrode 10 are arranged at two sides of the gate region, respectively. Each of the source electrode 9 and the drain electrode 10 is through the silicon nitride layer 8, the silicon aluminum nitride layer 7 and the silicon nitride layer 6 in a vertical direction, and contacts with the nitride barrier layer 5.

FIG. 2a-FIG. 2e are cross sections illustrating the insulating gate field effect transistor and a series of processes of a method for fabricating the same according to the first embodiment of the application.

Referring to FIG. 2a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride, etc.

A nitride transistor structure, which is preferably AlInGaN, is then prepared on the substrate 1. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be AlInGaN. The nitride buffer layer 3 may be, for example, AlGaN. The nitride channel layer 4 may be, for example, GaN. The nitride barrier layer 5 may be, for example, AlInGaN. The nitride barrier layer 5 is made of AlInGaN with an aluminum-rich structure. Therefore, density of two-dimensional electron gas may be high, and sheet resistance is greatly reduced. In other embodiments, the nitride barrier layer 5 may not be arranged.

A dielectric layer is then grown on the accomplished nitride transistor structure. A gate region is defined on the dielectric layer. Specifically, a silicon nitride layer 6, a silicon aluminum nitride layer 7 and a silicon nitride layer 8 are grown on the accomplished nitride transistor structure in sequence. In the embodiment, a composite dielectric layer is obtained by introducing metal aluminum into a silicon nitride layer, i.e., generating a silicon nitride layer-silicon aluminum nitride layer-silicon nitride layer. The silicon aluminum nitride layer 7 may be used to control etching speed and etching depth to achieve accurate control to a gate voltage. The silicon nitride layer 6 has a dense structure and good quality; thereby the leakage current of the gate can be greatly reduced. The current collapse effect can be reduced by adopting a structure of a thick silicon nitride passivation layer 8.

Referring to FIG. 2b, the nitride transistor structure is exposed by etching the dielectric layer at two sides of the gate region. In the embodiment, the nitride barrier layer 5 may be exposed, for example, by dry etching, or the nitride barrier layer 5 may even be etched through, to form two ohmic contact regions.

Referring to FIG. 2c, a source electrode 9 is formed on one ohmic contact region and a drain electrode 10 is formed on the other ohmic contact region finally.

Figure 2D:
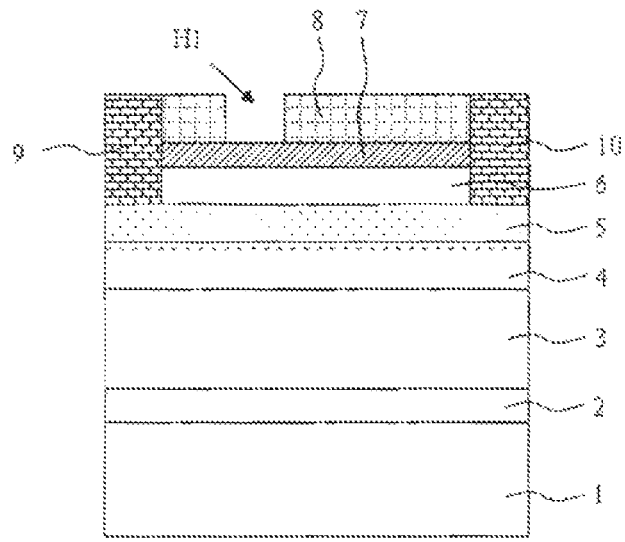
Figure 2E:
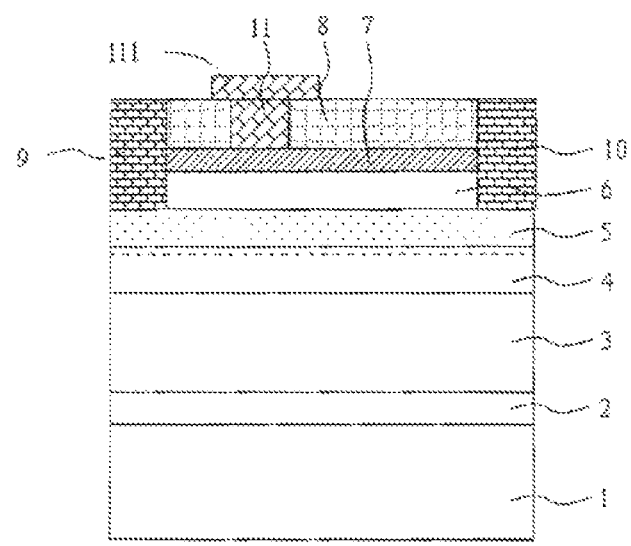

Referring to FIG. 2d, a groove H1 at least partially through the dielectric layer is formed by etching a gate region of the dielectric layer. Here the partially through indicates that the bottom of the groove is located within the dielectric layer. The etching may be fluorine-based ion etching, for example. The speed of etching the silicon aluminum nitride layer 7 with fluorine-based ions is much lower than the speed of etching the silicon nitride layer 8 with fluorine-based ions. In etching the gate region to form the groove H1, a process of etching is very easy to be controlled in the silicon aluminum nitride layer 7 after the silicon nitride layer 8 is etched away due to the significant difference in etching speed. Therefore, the depth of the groove H1 can be accurately controlled. The groove H1 may also be formed by other dry etching with selectivity.

Referring to FIG. 2c, a metal gate 11 with a field plate structure 111 is deposited in the groove H1. The metal gate 11 is a metal conductive electrode, whose material may be selected from one or any combination of metal Ni, Au, Pt, Ti and Al, etc.

Figure 3A:
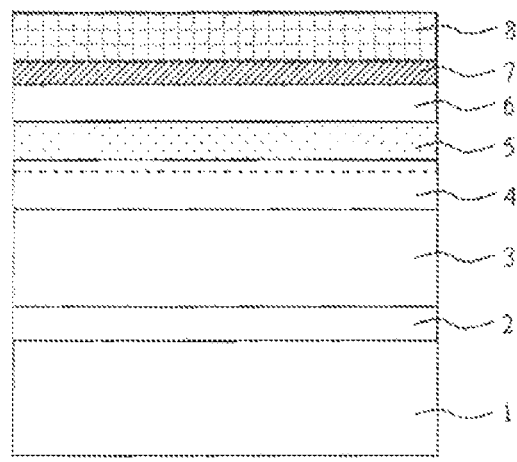
FIG. 3a-FIG. 3f are cross sections illustrating an insulating gate field effect transistor and a series of processes of a method for fabricating the same according to a second embodiment of the application.
Figure 3B:
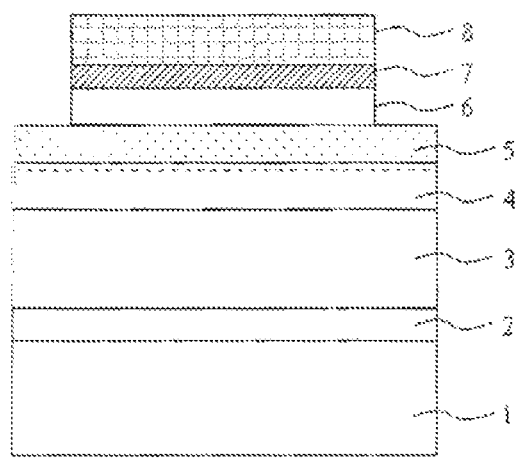
Figure 3C:
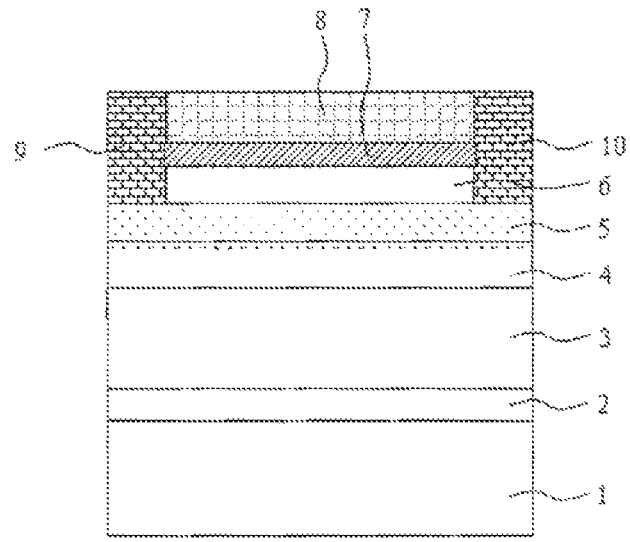
Figure 3D:
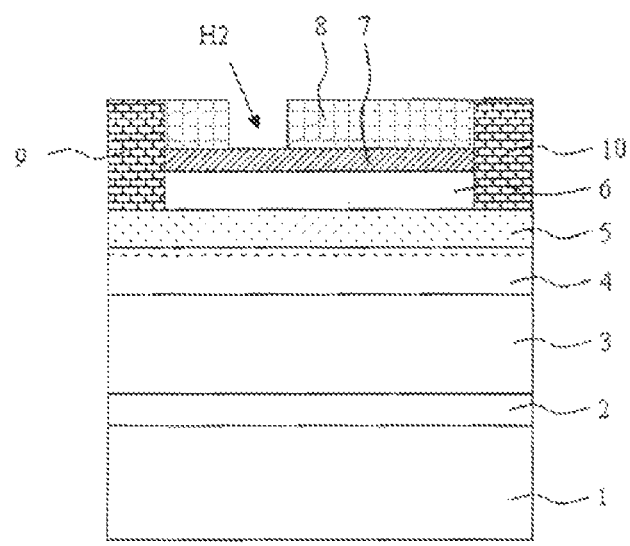
Figure 3E:
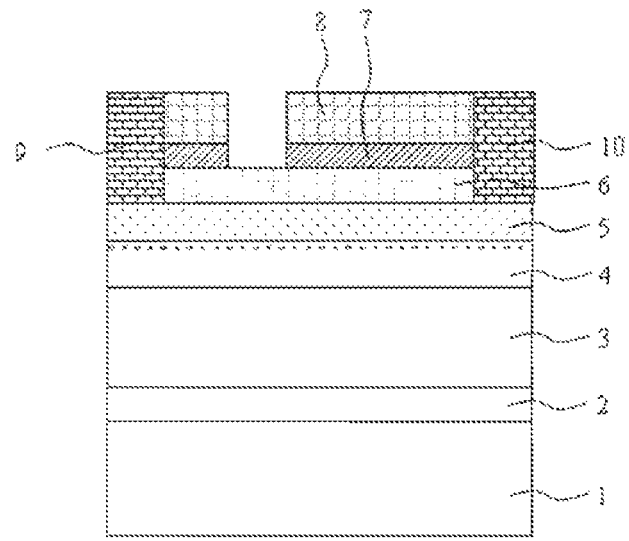
Figure 3F:
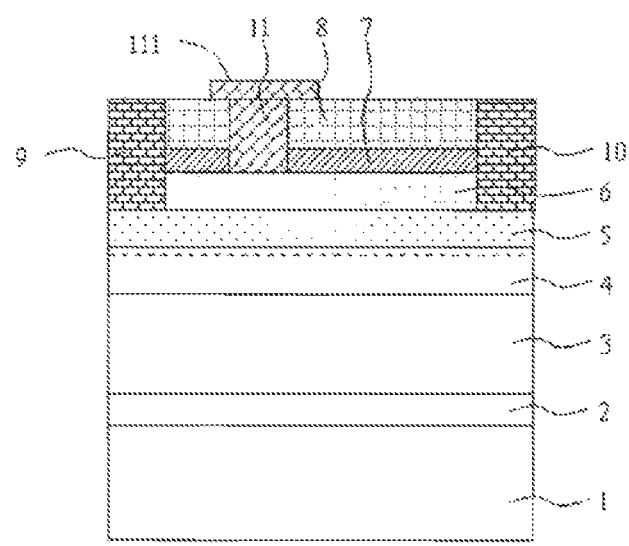

Referring to FIG. 3f, in a second embodiment of the application, an insulating gate field effect transistor includes: a substrate 1, and a nitride nucleation layer 2, a nitride buffer layer 3, a nitride channel layer 4, a nitride barrier layer 5, a silicon nitride layer 6 (a first dielectric layer), a silicon aluminum nitride layer 7 (a second dielectric layer) and a silicon nitride layer 8 (a third dielectric layer) which are formed on the substrate 1 in sequence. A groove H2 is arranged in a gate region of the silicon nitride layer 8 (referring to FIG. 2d). A height of the groove H2 is equal to a sum of a thickness of the silicon nitride layer 8 and a thickness of the silicon aluminum nitride layer 7. A metal gate 11 is formed in the groove H2. Insulating gate dielectric below the metal gate 11 is the silicon nitride layer 6. The metal gate 11 has a field plate structure 111. A source electrode 9 and a drain electrode 10 are arranged at two sides of the gate region, respectively. Each of the source electrode 9 and the drain electrode 10 is through the silicon nitride layer 8, the silicon aluminum nitride layer 7 and the silicon nitride layer 6 in a vertical direction, and contacts with the nitride barrier layer 5.

FIG. 3a-FIG. 3f are cross sections illustrating the insulating gate field effect transistor and a series of processes of a method for fabricating the same according to the second embodiment of the application.

Referring to FIG. 3a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride, etc.

A nitride transistor structure, which is preferably AlInGaN, is then prepared on the substrate 1. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be AlInGaN. The nitride buffer layer 3 may be, for example, AlGaN. The nitride channel layer 4 may be, for example, GaN. The nitride barrier layer 5 may be, for example, AlInGaN. The nitride barrier layer 5 is made of AlInGaN with an aluminum-rich structure. Therefore, density of two-dimensional electron gas may be high, and sheet resistance is greatly reduced. In other embodiments, the nitride barrier layer 5 may not be arranged.

A dielectric layer is then grown on the accomplished nitride transistor structure. A gate region is defined on the dielectric layer. Specifically, a silicon nitride layer 6, a silicon aluminum nitride layer 7 and a silicon nitride layer 8 are grown on the accomplished nitride transistor structure in sequence. In the embodiment, a composite dielectric layer is obtained by introducing aluminum into a silicon nitride layer, i.e., generating a silicon nitride layer-silicon aluminum nitride layer-silicon nitride layer. The silicon aluminum nitride layer 7 may be used to control etching speed and etching depth of fluorine-based ion etching to achieve accurate control to a gate voltage. The silicon nitride layer 6 has a dense structure and good quality; thereby the leakage current of the gate can be greatly reduced. The current collapse effect can be reduced by adopting a structure of a thick silicon nitride passivation layer 8.

Referring to FIG. 3b, the nitride transistor structure is exposed by etching the dielectric layer at two sides of the gate region. In the embodiment, the nitride barrier layer 5 may be exposed by dry etching, or the nitride barrier layer 5 may even be etched through, to form two ohmic contact regions.

Referring to FIG. 3c, a source electrode 9 is formed on one ohmic contact region and a drain electrode 10 is formed on the other ohmic contact region finally.

Referring to FIG. 3d, a groove H2 at least partially through the dielectric layer is formed by etching a gate region of the dielectric layer. Here the partially through indicates that the bottom of the groove is located within the dielectric layer. The etching may be fluorine-based ion etching, for example. The groove H2 may also be formed by other dry etching with selectivity.

Referring to FIG. 3e, after the dry etching based on fluorine-based ions, the silicon aluminum nitride layer 7 may be removed by wet etching based on KOH or dry etching based on chloridions.

Referring to FIG. 3f, a metal gate 11 with a field plate structure 111 is deposited so the groove 112. The metal gate 11 is a metal conductive electrode, whose material may be selected from one or any combination of metal Ni, Au, Pt, Ti and Al, etc.

Figure 4A:
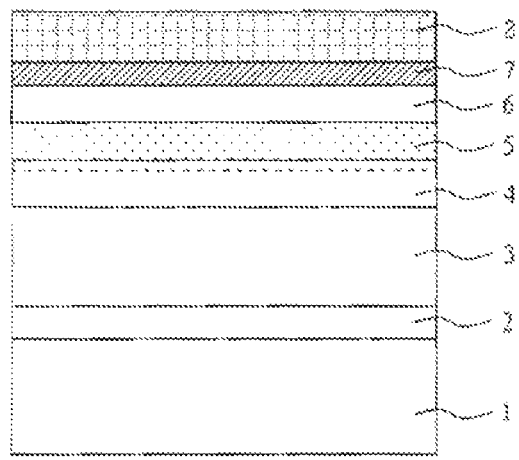
FIG. 4a-FIG. 4f are cross sections illustrating an insulating gate field effect transistor and a series of processes of a method for fabricating the same according to a third embodiment of the application.
Figure 4B:
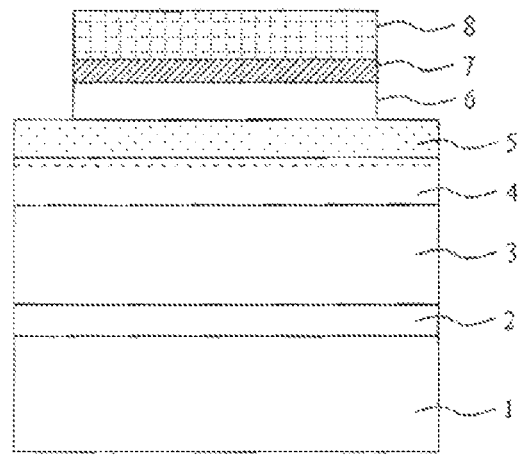
Figure 4C:
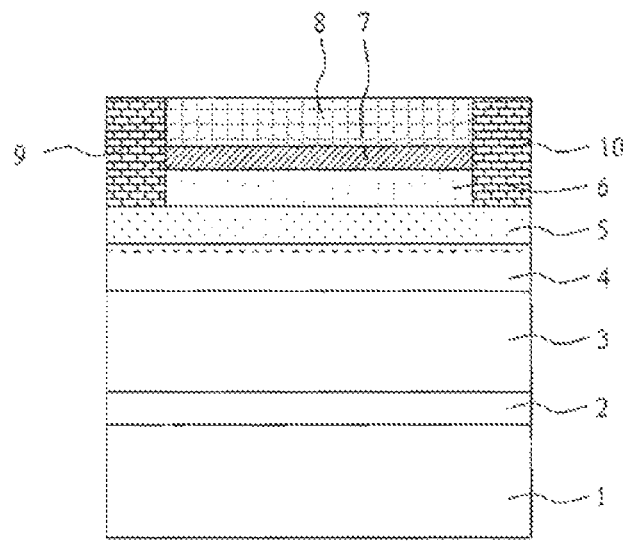
Figure 4D:
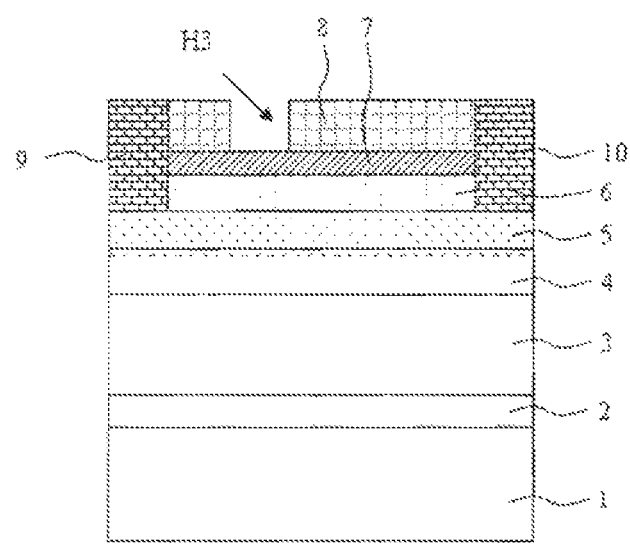
Figure 4E:
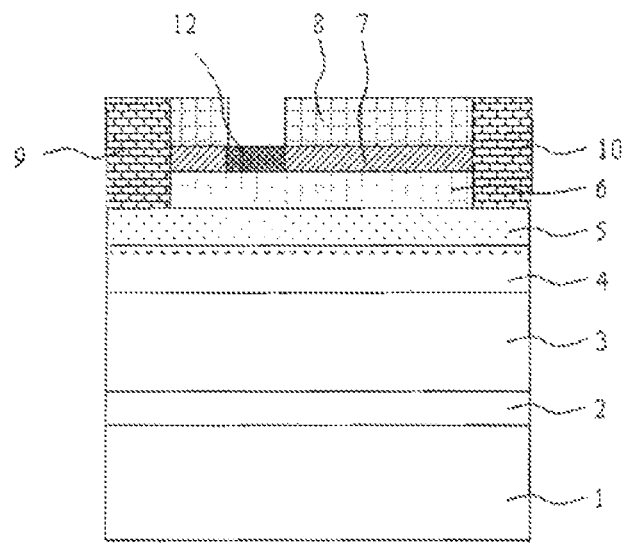
Figure 4F:
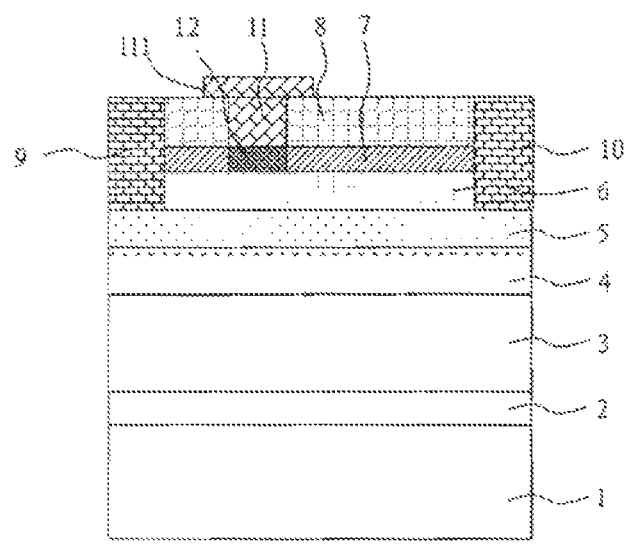

Referring to FIG. 4f in a third embodiment of the application, an insulating gate field effect transistor includes: a substrate 1, and a nitride nucleation layer 2, a nitride buffer layer 3, a nitride channel layer 4, a nitride barrier layer 5, a silicon nitride layer 6 (a first dielectric layer), a silicon aluminum nitride layer 7 (a second dielectric layer) and a silicon nitride layer 8 (a third dielectric layer) which are formed on the substrate 1 in sequence. A groove H3 is arranged in a gate region of the silicon nitride layer 8 (referring to FIG. 3d). A height of the groove 113 is equal to a thickness of the silicon nitride layer 8. A metal gate 11 is formed in the groove H3. An aluminum oxide layer 12 is further formed between the metal gate 11 and the silicon nitride layer 6. Insulating gate dielectric below the metal gate 11 is composed of the silicon nitride layer 6 and the aluminum oxide layer 12. The metal gate 11 has a field plate structure 111. A source electrode 9 and a drain electrode 10 are arranged at two sides of the gate region, respectively. Each of the source electrode 9 and the drain electrode 10 is through the silicon nitride layer 8, the silicon aluminum nitride layer 7 and the silicon nitride layer 6 in a vertical direction, and contacts with the nitride barrier layer 5.

FIG. 4a-FIG. 4f are cross sections illustrating the insulating gate field effect transistor and a series of processes of a method for fabricating the same according to the third embodiment of the application.

Referring to FIG. 4a, a substrate 1 is provided at first. The substrate 1 may be selected from semiconductor material, ceramic material or macromolecular material, etc. In this embodiment the substrate 1 is preferably selected from sapphire, silicon carbide, silicon, lithium niobate, silicon-on-insulator substrate (SOI), gallium nitride or aluminum nitride, etc.

A nitride transistor structure, which is preferably AlInGaN, is then prepared on the substrate 1. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be AlInGaN. The nitride buffer layer 3 may be, for example, AlGaN. The nitride channel layer 4 may be, for example, GaN. The nitride barrier layer 5 may be, for example, AlInGaN. The nitride barrier layer 5 is made of AlInGaN with an aluminum-rich structure. Therefore, density of two-dimensional electron gas may be high, and sheet resistance is greatly reduced, in other embodiments, the nitride barrier layer 5 may not be arranged.

A dielectric layer is then grown on the accomplished nitride transistor structure. A gate region is defined on the dielectric layer. Specifically, a silicon nitride layer 6, a silicon aluminum nitride layer 7 and a silicon nitride layer 8 are grown on the accomplished nitride transistor structure in sequence. In the embodiment, a composite dielectric layer is obtained by introducing metal aluminum into a silicon nitride layer, to generate a silicon nitride layer-silicon aluminum nitride layer-silicon nitride layer. The silicon aluminum nitride layer 7 may be used to control etching speed and etching depth of fluorine-based ion etching to achieve accurate control to a gate voltage. The silicon nitride layer 6 has a dense structure and good quality; thereby the leakage current of the gate can be greatly reduced. The current collapse effect can be reduced by adopting a structure of a thick silicon nitride passivation layer 8.

Referring to FIG. 4b, the nitride transistor structure is exposed by etching the dielectric layer at two sides of the gate region. In the embodiment, the nitride barrier layer 5 may be exposed, for example, by dry etching, or the nitride barrier layer 5 may even be etched through, to form two ohmic contact regions.

Referring to FIG. 4c, a source electrode 9 is formed on one ohmic contact region and a drain electrode 10 is formed on the other ohmic contact region finally.

Referring to FIG. 4d, a groove H3 at least partially through the dielectric layer is formed by etching a gate region of the dielectric layer. Here the partially through indicates that the bottom of the groove is located within the dielectric layer. The etching may be fluorine-based plasma etching, for example. The groove H3 may also be formed by other dry etching with selectivity.

Referring to FIG. 4e, after the etching, the silicon aluminum nitride layer 7 corresponding to a place of the groove H3 is oxidized by methods such as thermal oxidation, wet oxidation, oxygen ions or ozone, to form aluminum oxide, silicon aluminum oxide, silicon aluminum oxynitride, aluminum oxynitride 12 or a mixture thereof. The leakage current of the gate can be further reduced after the oxidation. The oxidized silicon aluminum nitride layer 7 and the silicon nitride layer 6 compose a composite dielectric layer, to form an insulating gate structure.

Referring to FIG. 4f, a metal gate 11 with a field plate structure 111 is deposited in the groove H3. The metal gate 11 is a metal conductive electrode, whose material may be selected from one or any combination of metal Ni, Au, Pt, Ti and Al, etc.

In the third embodiment of the application, after the silicon aluminum nitride layer 7 is oxidized, an additional dielectric layer may further be deposited in the groove H3 formed by etching and on an upper surface of the silicon nitride layer 8. Material of the additional dielectric layer may include, for example, $Al_2O_3$ or AlON. The additional dielectric layer may be grown by atomic layer deposition, chemical vapor deposition, molecular beam epitaxy, plasma enhanced chemical vapor deposition or low pressure chemical vapor deposition, or a combination thereof. It should be understood that the methods for forming the additional dielectric layer described herein are merely for illustration. In the application, the additional dielectric layer may be formed by any method known to those skilled in the art. Material of the additional dielectric layer may also be selected from one or any combination of SiN, SiON, $SiO_2$, $HfO_2$, AlN, SiAlN, HfAlO, $TiO_2$ and NiO.

Figure 5A:
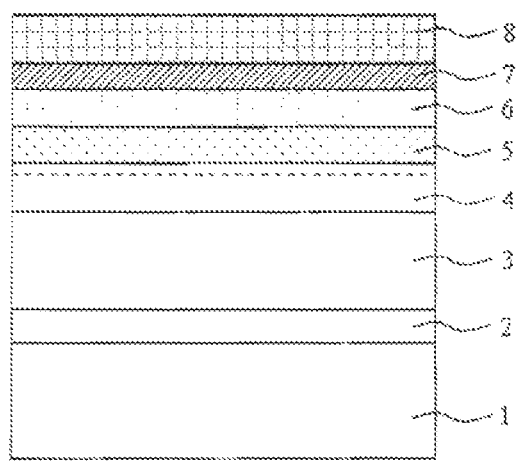
FIG. 5a-FIG. 5f are cross sections illustrating an insulating gate field effect transistor and a series of processes of a method for fabricating the same according to a fourth embodiment of the application.
Figure 5B:
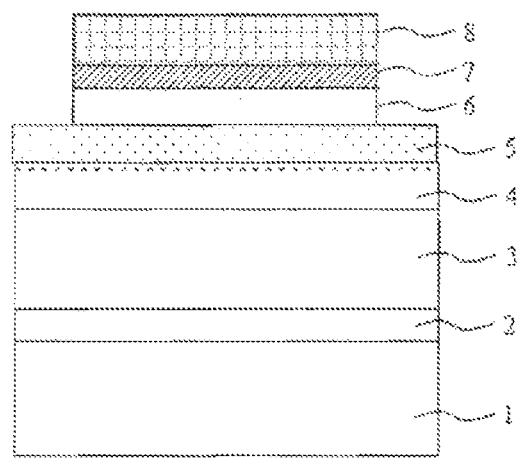
Figure 5C:
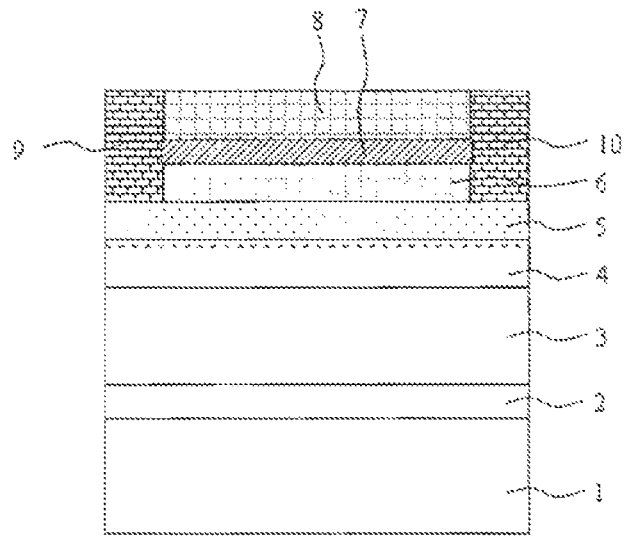
Figure 5D:
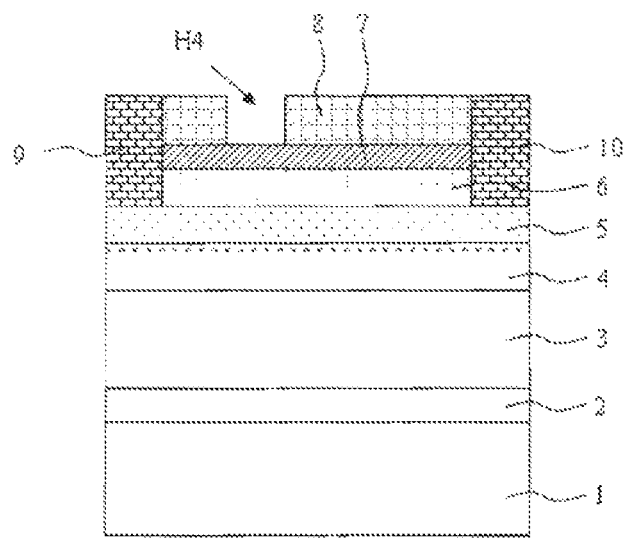
Figure 5E:
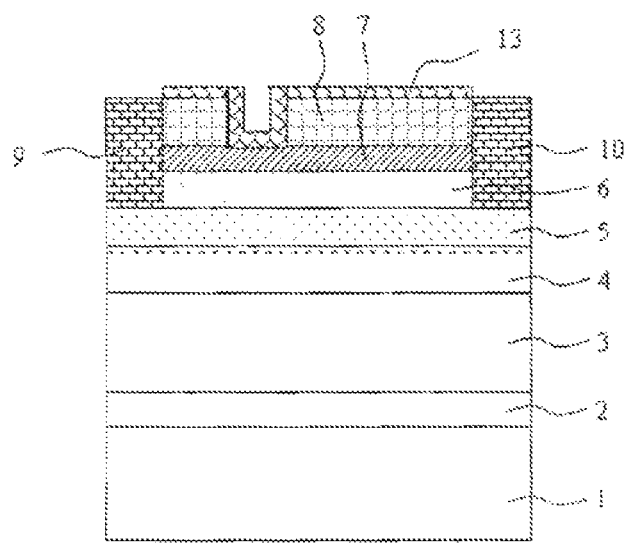
Figure 5F:
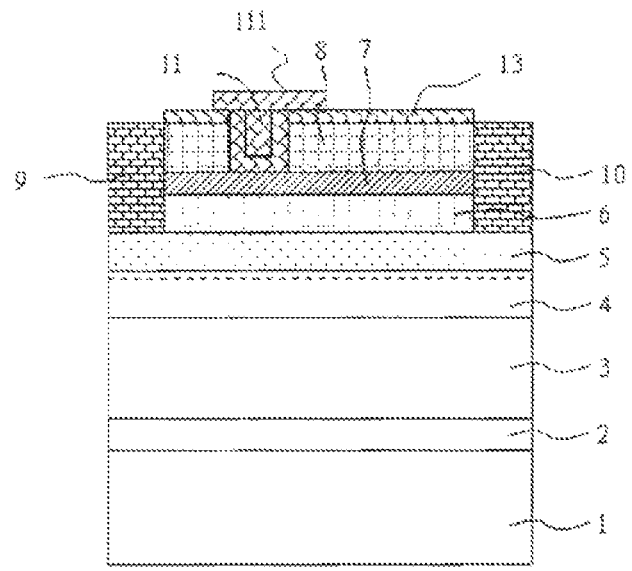

Referring to FIG. 5f, in a forth embodiment of the application, an insulating gate field effect transistor includes: a substrate 1, and a nitride nucleation layer 2, a nitride buffer layer 3, a nitride channel layer 4, a nitride barrier layer 5, a silicon nitride layer 6 (a first dielectric layer), a silicon aluminum nitride layer 7 (a second dielectric layer) and a silicon nitride layer 8 (a third dielectric layer) which are formed on the substrate 1 in sequence. A groove H4 is arranged in a gate region of the silicon nitride layer 8 (referring to FIG. 5d). A height of the groove H4 is equal to a thickness of the silicon nitride layer 8. An additional dielectric layer 13 is formed on an inner wall of the groove H4 and on a surface of the silicon nitride layer 8. A metal gate 11 is arranged in the groove H4 and on the additional dielectric layer 13. The metal gate 11 has a field plate structure 111. A source electrode 9 and a drain electrode 10 are arranged at two sides of the gate region, respectively.

Each of the source electrode 9 and the drain electrode 10 is through the silicon nitride layer 8, the silicon aluminum nitride layer 7 and the silicon nitride layer 6 in a vertical direction, and contacts with the nitride barrier layer 5.

FIG. 5a-FIG. 5f are cross sections illustrating the insulating gate field effect transistor and a series of processes of a method for fabricating the same according to the fourth embodiment of the application.

Referring to FIG. 5a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride, etc.

A nitride transistor structure, which is preferably AlInGaN, is then prepared on the substrate 1. Specifically a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be AlInGaN. The nitride buffer layer 3 may be, for example, AlGaN. The nitride channel layer 4 may be, for example, GaN. The nitride barrier layer 5 may be, for example, AlInGaN. The nitride barrier layer 5 is made of AlInGaN with an aluminum-rich structure. Therefore, density of two-dimensional electron gas may be high, and sheet resistance is greatly reduced. In other embodiments, the nitride barrier layer 5 may not be arranged.

A dielectric layer is then grown on the accomplished nitride transistor structure. A gate region is defined on the dielectric layer. Specifically, a silicon nitride layer 6, a silicon aluminum nitride layer 7 and a silicon nitride layer 8 are grown on the accomplished nitride transistor structure in sequence. In the embodiment, a composite dielectric layer is obtained by introducing metal aluminum into a silicon nitride layer, i.e., generating a composite dielectric layer of a silicon nitride layer-silicon aluminum nitride layer-silicon nitride layer. The silicon aluminum nitride layer 1 may be used to control etching speed and etching depth of fluorine-based ion etching, to achieve accurate control to a gate voltage. The silicon nitride layer 6 has a dense structure and good quality; thereby the leakage current of the gate can be greatly reduced. The current collapse effect can be reduced by adopting a structure of a thick silicon nitride passivation layer 8.

Referring to FIG. 5b, the nitride transistor structure is exposed by etching the dielectric layer at two sides of the gate region. In the embodiment, the nitride barrier layer 5 may be exposed, for example, by dry etching, or the nitride barrier layer S may even be etched through, to form two ohmic contact regions.

Referring to FIG. 5c, a source electrode 9 is formed on one ohmic contact region and a drain electrode 10 is formed on the other ohmic contact region finally.

Referring to FIG. 5d, a groove H4 at least partially through the dielectric layer is formed by etching a gate region of the dielectric layer. Here the partially through indicates that the bottom of the groove is located within the dielectric layer. The etching may be fluorine-based plasma etching, for example. The groove H4 may also be formed by other dry etching with selectivity.

Referring to FIG. 5e, an additional dielectric layer 13 is deposited in the groove H4 formed by etching and on an upper surface of the silicon nitride layer 8. Material of the additional dielectric layer 13 may include, for example, $Al_2O_3$ or AlON. The additional dielectric layer 13 may be grown by atomic layer deposition, chemical vapor deposition, molecular beam epitaxy, plasma enhanced chemical vapor deposition or low pressure chemical vapor deposition, or a combination thereof. It should be understood that the methods for forming the additional dielectric layer described herein are merely for illustration. In the application, the additional dielectric layer may be formed by any method known to those skilled in the art. Material of the additional dielectric layer may also be selected from one or any combination of SiN, SiON, $SiO_2$, $HfO_2$, AlN, SiAlN, HfAlO, $TiO_2$ and NiO.

Referring to FIG. 5f a metal gate 11 with a held plate structure 111 is deposited on the additional dielectric layer 13 in the groove H4. The metal gate 11 is a metal conductive electrode, whose material may be selected from one or any combination of metal Ni, Au, Pt, Ti and Al etc.

Figure 6A:
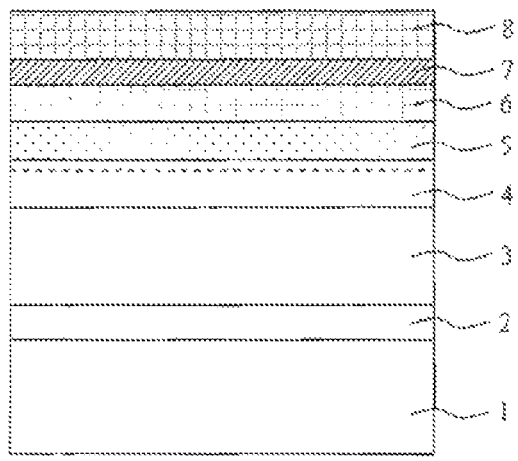
FIG. 6a-FIG. 6f are cross sections illustrating an insulating gate field effect transistor and a series of processes of a method for fabricating the same according to a fifth embodiment of the application.
Figure 6B:
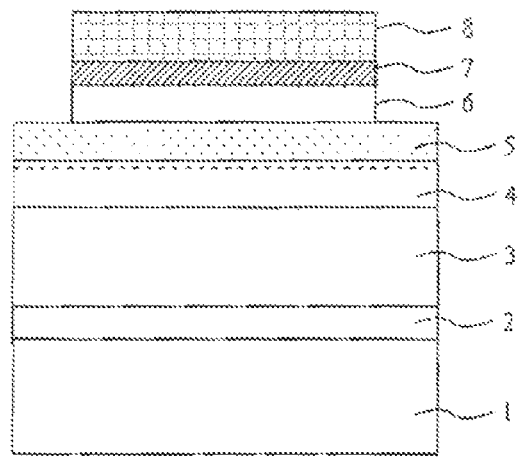
Figure 6C:
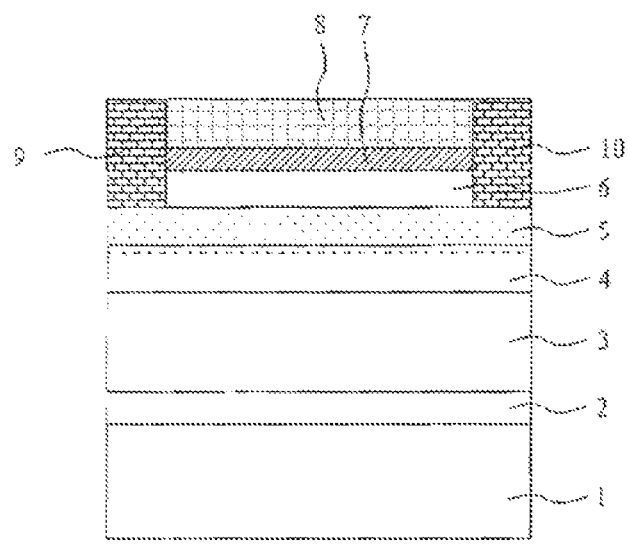
Figure 6D:
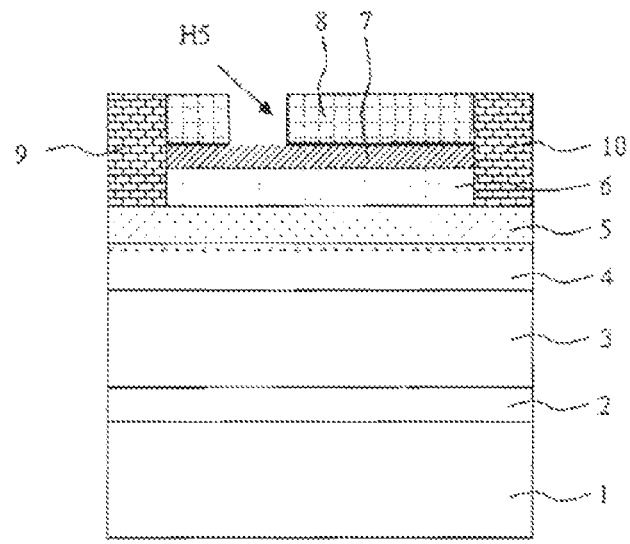
Figure 6E:
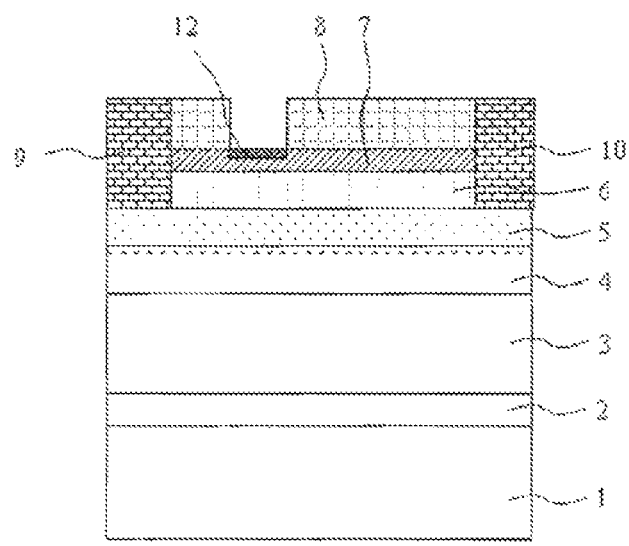
Figure 6F:
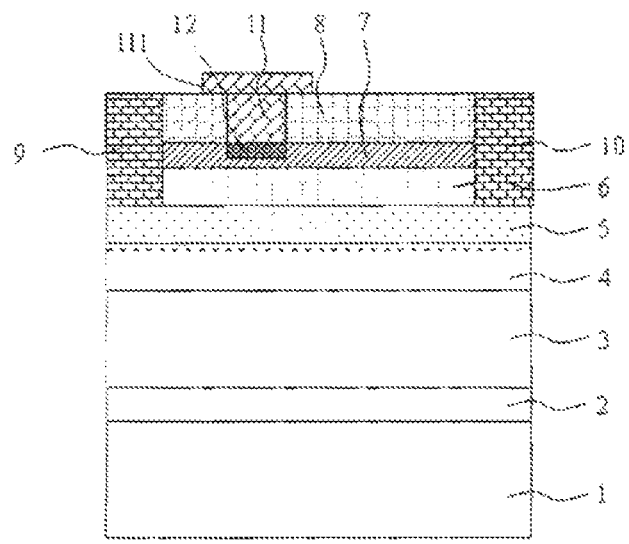

Referring to FIG. 6f, in a fifth embodiment of the application, an insulating gate field effect transistor includes: a substrate 1, and a nitride nucleation layer 2, a nitride buffer layer 3, a nitride channel layer 4, a nitride barrier layer 5, a silicon aluminum nitride layer 6 (a first dielectric layer), a silicon aluminum nitride layer 7 (a second dielectric layer) and a silicon nitride layer 8 (a third dielectric layer) which are formed on the substrate 1 in sequence. A groove H5 is arranged in a gate region of the silicon nitride layer 8 (referring to FIG. 6d). A height of the groove H5 is equal to a thickness of the silicon nitride layer 8. A metal gate 11 is formed in the groove H5. An oxidized silicon aluminum nitride layer 12 is further formed between the metal gate 11 and the silicon aluminum nitride layer 7. The metal gate 11 has a field plate structure 111. A source electrode 9 and a drain electrode 10 are arranged at two sides of the gate region, respectively. Each of the source electrode 9 and the drain electrode 10 is through the silicon nitride layer 8, the silicon aluminum nitride layer 7 and the silicon aluminum nitride layer 6 in a vertical direction, and contacts with the nitride harder layer 5.

FIG. 6a-FIG. 6f are cross sections illustrating the insulating gate field effect transistor and a series of processes of a method tor fabricating the same according to the fifth embodiment of the application.

Referring to FIG. 6a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride, etc.

A nitride transistor structure, which is preferably AlInGaN, is then prepared on the substrate 1. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be AlInGaN. The nitride buffer layer 3 may be, for example, AlGaN. The nitride channel layer 4 may be, for example, GaN. The nitride barrier layer 5 may be, for example, AlInGaN. The nitride barrier layer 5 is made of AlInGaN with an aluminum-rich structure. Therefore, density of two-dimensional electron gas may be high, and sheet resistance is greatly reduced. In other embodiments, the nitride barrier layer 5 may not be arranged.

A composite dielectric layer is then grown on the accomplished nitride transistor structure. A gate region is defined on the composite dielectric layer. Specifically, metal aluminum is introduced into the dielectric layer 6 and the dielectric layer 7 when growing the dielectric layer 6 and the dielectric layer 7 on the accomplished nitride transistor structure in sequence. Specifically, the structure of the composite dielectric layer includes a silicon aluminum nitride layer 6, a silicon aluminum nitride layer 7 and a silicon nitride layer 8. The introduced metal aluminum may be used to control etching speed and etching depth of ion etching, to achieve accurate control to a gate voltage. The current collapse effect can be reduced by adopting a structure of a thick silicon nitride passivation layer 8.

Referring to FIG. 6b, the nitride transistor structure is exposed by etching the dielectric layer at two sides of the gate region. In the embodiment, the nitride barrier layer 5 may be exposed, for example, by dry etching, or the nitride harrier layer 5 may even be etched through, to form two ohmic contact regions.

Referring to FIG. 6c, a source electrode 9 is formed on one ohmic contact region and a drain electrode 10 is formed on the other ohmic contact region finally.

Referring to FIG. 6d, a groove H5 at least partially through the dielectric layer is formed by etching a gate region of the dielectric layer. Here the partially through indicates that the bottom of the groove is located within the dielectric layer. The etching may be fluorine-based plasma etching, for example. The groove H5 may also be formed by other dry etching with selectivity.

Referring to FIG. 6e, after the etching, the silicon aluminum nitride layer 7 corresponding to a place of the groove H5 is oxidized partially by methods such as thermal oxidation, wet oxidation, oxygen ions or ozone. For example, only a few nanometers of a surface of the silicon aluminum nitride layer 7 is oxidized to form aluminum oxide, silicon aluminum oxide, silicon aluminum oxynitride, aluminum oxynitride or a mixture thereof 12. The leakage current of the gate can be further reduced after the oxidation.

Referring to FIG. 6f, a metal gate 11 with a field plate structure 111 is deposited in the groove H5. The metal gate 11 is a metal conductive electrode, whose material may be selected from one or any combination of metal Ni, Au, Pt, Ti and Al, etc.

Figure 7A:
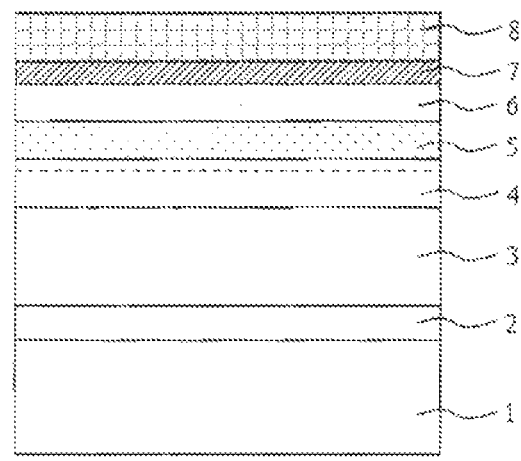
FIG. 7a-FIG. 7g are cross sections illustrating an insulating gate field effect transistor and a series of processes of a method for fabricating the same according to a sixth embodiment of the application.
Figure 7B:
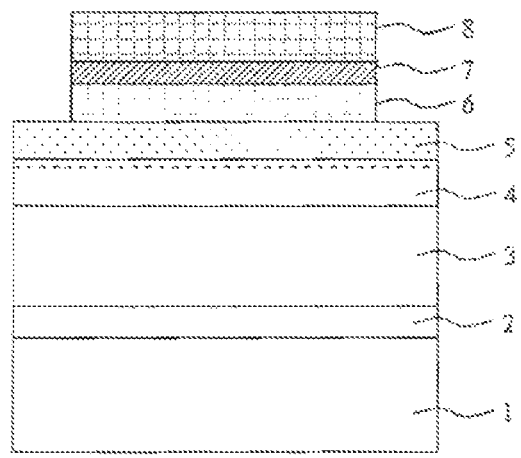
Figure 7C:
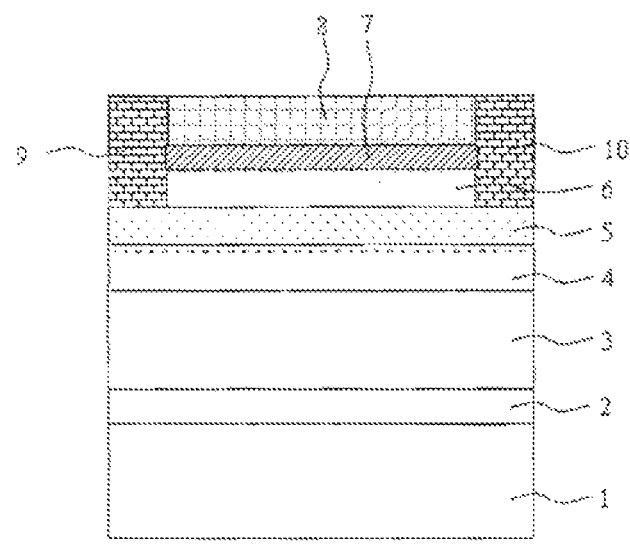
Figure 7D:
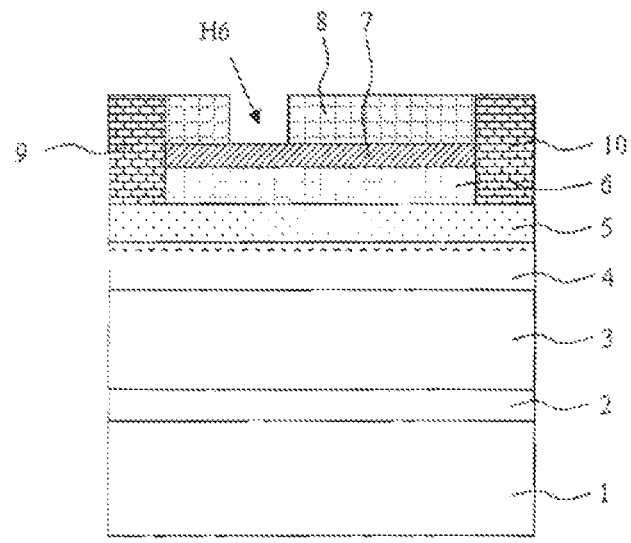
Figure 7E:
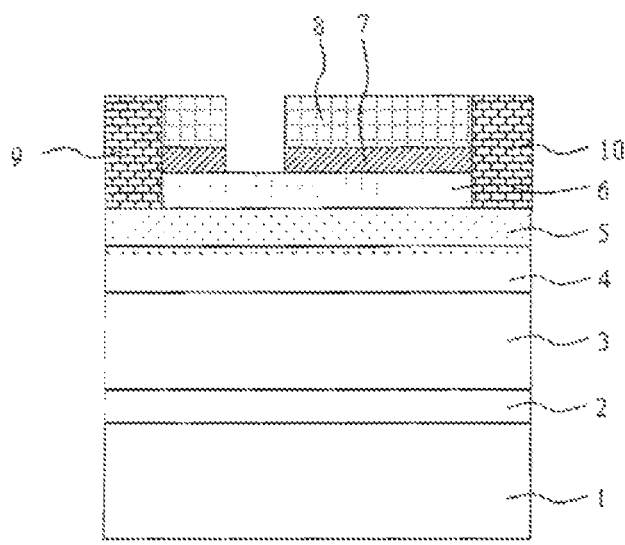
Figure 7F:
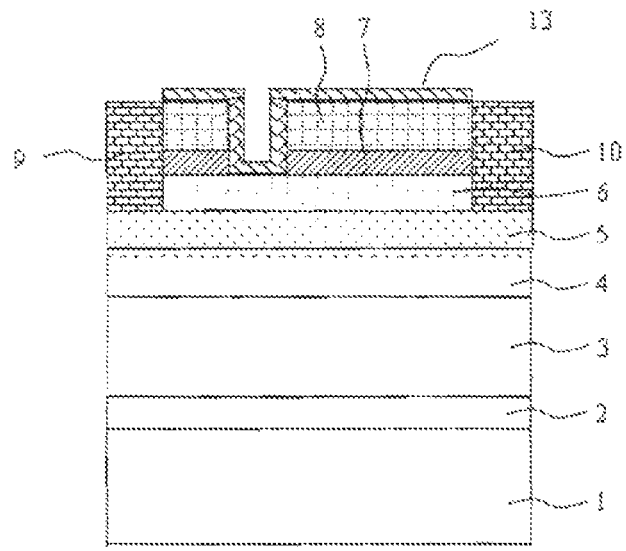
Figure 7G:
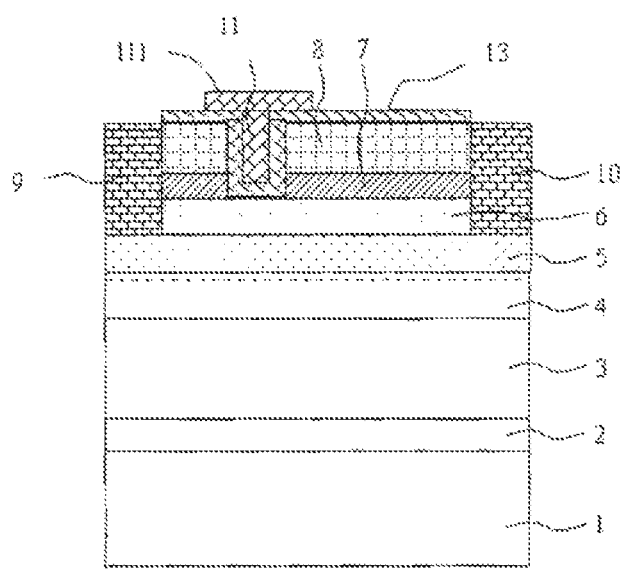

Referring to FIG. 7g, in a sixth embodiment of the application, an insulating gate field effect transistor includes: a substrate 1, and a nitride nucleation layer 2, a nitride buffer layer 3, a nitride channel layer 4, a nitride barrier layer 5, a silicon nitride layer 6 (a first dielectric layer), a silicon aluminum nitride layer 7 (a second dielectric layer) and a silicon nitride layer 8 (a third dielectric layer) which are formed on the substrate 1 in sequence. A groove H6 is arranged in a gate region of the silicon nitride layer 8 (referring to FIG. 7d). A height of the groove H6 is equal to a sum of a thickness of the silicon aluminum nitride layer 7 and a thickness of the silicon nitride layer 8. An additional dielectric layer 13 is formed on an inner wall of the groove H6 and on a surface of the silicon nitride layer 8. A metal gate 11 is arranged in the groove H6 and located on the additional dielectric layer 13. The metal gate 11 has a field plate structure 111. A source electrode 9 and a drain electrode 10 are arranged at two sides of the gate region, respectively. Each of the source electrode 9 and the drain electrode 10 is through the silicon nitride layer 8, the silicon aluminum nitride layer 7 and the silicon nitride layer 6 in a vertical direction, and contacts with the nitride barrier layer 5.

FIG. 7a-FIG. 7g are cross sections illustrating the insulating gate field effect transistor and a series of processes of a method for fabricating the same according to the sixth embodiment of the application.

Referring to FIG. 7a, a substrate 1 is provided at first. The substrate 1 may be selected front semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride, etc.

A nitride transistor structure, which is preferably AlInGaN, is then prepared on the substrate 1. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be AlInGaN. The nitride buffer layer 3 may be, for example, AlGaN. The nitride channel layer 4 may be, for example, GaN. The nitride barrier layer 5 may be, for example, AlInGaN. The nitride barrier layer 5 is made of AlInGaN with an aluminum-rich structure. Therefore, density of two-dimensional electron gas may be high, and sheet resistance is greatly reduced. In other embodiments, the nitride barrier layer 5 may not be arranged.

A dielectric layer is then grown on the accomplished nitride transistor structure. A gate region is defined on the dielectric layer. Specifically, metal aluminum is introduced into the dielectric layer when growing the dielectric layer on the accomplished nitride transistor structure, to form a structure of a composite dielectric layer. The composite dielectric layer is particularly includes a silicon nitride layer 6, a silicon aluminum nitride layer 7 and a silicon nitride layer 8. The metal aluminum may be used to control etching speed and etching depth of ion etching, to achieve accurate control to a gate voltage. The silicon nitride layer 6 has a dense structure and good quality; thereby the leakage current of the gate can be greatly reduced. The current collapse effect can be reduced by adopting a structure of a thick silicon nitride passivation layer 8.

Referring to FIG. 7b, the nitride transistor structure is exposed by etching the dielectric layer at two sides of the gate region. In the embodiment, the nitride barrier layer 5 may be exposed, for example, by dry etching, or the nitride barrier layer 5 may even be etched through, to form two ohmic contact regions.

Referring to FIG. 7c, a source electrode 9 is formed on one ohmic contact region and a drain electrode 10 is formed on the other ohmic contact region finally.

Referring to FIG. 7d, a groove H6 at least partially through the dielectric layer is formed by etching a gate region of the dielectric layer. Here the partially through indicates that the bottom of the groove is located within the dielectric layer. The etching may be fluorine-based plasma etching, for example. The groove H6 may also be formed by other dry etching with selectivity.

Then the silicon aluminum nitride layer 7 may be removed by wet etching based on KOH or dry etching based on chloridions.

Referring to FIG. 7f, an additional dielectric layer 13 is deposited in the groove H6 formed by etching and on an upper surface of the silicon nitride layer 8. Material of the additional dielectric layer may include, for example, $Al_2O_3$ or AlON. The additional dielectric layer 13 may be grown by atomic layer deposition, chemical vapor deposition, molecular beam epitaxy, plasma enhanced chemical vapor deposition or low pressure chemical vapor deposition, or a combination thereof. It should be understood that the methods for forming the additional dielectric layer described herein are merely for illustration. In the application, the additional dielectric layer may be formed by any method known to those skilled in the art. Material of the additional dielectric layer may also be selected from one or any combination of SiN, SiON, $SiO_2$, $HfO_2$, AlN, SiAlN, HfAlO, $TiO_2$ and NiO.

Referring to FIG. 7g, a metal gate 11 with a field plate structure 111 is deposited on the additional dielectric layer 13 in the groove H6. The metal gate 11 is a metal conductive electrode, whose material may be selected from one or any combination of metal Ni, Au, Pt, Ti and Al, etc.

In the insulating gate field effect transistor of the application, the first dielectric layer is a nitride dielectric layer, and material of the second dielectric layer contains metal, where the metal may also be magnesium. A thickness of the first dielectric layer is preferably 0.25-50 nm. A thickness of the second dielectric layer is preferably 0.25-50 nm. A thickness of the third dielectric layer is preferably 1-300 nm.

By the aforesaid embodiments, advantages of the insulating gate field effect transistor fabricated by the method for fabricating the same are as follows.

In the application, metal is introduced into a dielectric layer when growing the dielectric layer on the nitride transistor structure, therefore, etching speed and etching depth of ion etching can be controlled. A groove structure is formed in a gate region of the dielectric layer and a metal gate is arranged in the groove, therefore, air contaminations to the surface of the nitride or damages in the process are greatly reduced. The dielectric layer is made of material such as SiN, which has high thermal stability, therefore, the surface of the nitride transistor can be stabilized, and defects and density of the surface state are reduced. Thus, electrical properties and surface quality of the insulating gate field effect transistor of the application and structure quality of the nitride transistor are greatly improved. For example, the current collapse effect is restrained.

It should be understood that, although the specification is described by the embodiments, it is not indicates that each embodiment includes only one independent technical solution. The way of description is merely for clarity. Those skilled in the art should consider the specification as a whole. Solutions in various embodiments may be combined appropriately to form other embodiments understandable to those skilled in the art.

The series of detailed description listed above are merely detailed description for feasible embodiments of the application, which are not to limit the scope of the application. Any equivalent embodiment or modification without departing from the art and spirit of the application should be contained within the scope of the application.

The invention claimed is:
1. An insulating gate field effect transistor, comprising:
a substrate;
a nitride transistor structure arranged on the substrate;
a dielectric layer on the nitride transistor structure, wherein the dielectric layer comprises a first dielectric layer on the nitride transistor structure, a second dielectric layer on the first dielectric layer, and a third dielectric layer on the second dielectric layer, wherein material of both the first dielectric layer and the second dielectric layer comprise metal, a gate region and two ohmic contact regions respectively located at two sides of the gate region are defined on the dielectric layer, and each of the two ohmic contact regions is through the dielectric layer;

a groove formed in the gate region, wherein the groove is at least partially through the dielectric layer in a thickness direction, with sidewalls of the groove being substantially plane, and wherein an oxidized dielectric is disposed at the bottom of the groove, the oxidized dielectric comprising the metal and the dielectric layer material;

a metal gate formed in the groove, wherein the metal gate is in direct contact with the dielectric layer or in indirect contact with the dielectric layer through an additional dielectric layer; and a source electrode and a drain electrode located at the two ohmic contact regions.

2. The insulating gate field effect transistor according to claim 1, wherein the nitride transistor structure comprises:
a nitride nucleation layer located on the substrate;
a nitride buffer layer located on the nitride nucleation layer;
a nitride channel layer located on the nitride buffer layer; and
a nitride barrier layer located on the nitride channel layer.

3. The insulating gate field effect transistor according to claim 2, wherein the nitride nucleation layer is AlInGaN, the nitride buffer layer is AlGaN, the nitride channel layer is GaN, and the nitride barrier layer is AlInGaN.

4. The insulating gate field effect transistor according to claim 1, wherein the first dielectric layer is selected from one or any combination of silicon nitride, aluminum nitride, silicon oxynitride, silicon aluminum nitride, aluminum oxynitride, hafnium oxide, aluminum hafnium oxide, titanium oxide and nickel oxide.

5. The insulating gate field effect transistor according to claim 1, wherein the second dielectric layer is selected from aluminum nitride, silicon aluminum nitride, aluminum oxide, aluminum oxynitride, magnesium nitride, silicon magnesium nitride, magnesium oxide, magnesium oxynitride, magnesium aluminum nitride, silicon magnesium aluminum nitride or magnesium aluminum oxide.

6. The insulating gate field effect transistor according to claim 1, wherein the third dielectric layer is selected from silicon nitride, silicon dioxide, silicon aluminum nitride or silicon oxynitride.

7. The insulating gate field effect transistor according to claim 1, wherein the metal gate further comprises a field plate structure.

8. The insulating gate field effect transistor according to claim 1, wherein an additional dielectric layer is further deposited on an inner wall of the groove, and the metal gate is formed on the additional dielectric layer, wherein material of the additional dielectric layer is selected from one or any combination of $Al_2O_3$, AlON, SiN, SiON, $SiO_2$, HfAlO, $TiO_2$, NiO, $HfO_2$, AlN and SiAlN.

9. The insulating gate field effect transistor according to claim 1, wherein the first dielectric layer has a thickness of 0.25-50 nm, the second dielectric layer has a thickness of 0.25-50 nm, and the third dielectric layer has a thickness of 1-300 nm.

10. A method for fabricating the insulating gate field effect transistor of claim 1, comprising steps as follows:
providing a substrate, and forming a nitride transistor structure on the substrate;
providing a dielectric layer on the formed nitride transistor structure, wherein providing the dielectric layer comprises growing a first dielectric layer, a second dielectric layer and a third dielectric layer, wherein material of both the first dielectric layer and the second dielectric layer comprise metal, and a gate region is defined on the third dielectric layer;
forming, in the gate region, a groove extending toward the nitride transistor structure, wherein the groove is at least partially through the dielectric layer in a thickness direction, with sidewalls of the groove being substantially plane;
oxidizing the dielectric layer below the groove to form an oxidized dielectric layer comprising the metal; and
forming a metal gate in the groove, wherein the metal gate is in direct contact with the dielectric layer or in indirect contact with the dielectric layer through an additional dielectric layer;
etching the dielectric layer at two sides of the gate region to form two ohmic contact regions; and
forming a source electrode and a drain electrode at the two ohmic contact regions, respectively.

11. The method for fabricating the insulating gate field effect transistor according to claim 10, wherein forming the groove comprises etching the third dielectric layer with fluorine-based plasmas.

12. The method for fabricating the insulating gate field effect transistor according to claim 10, wherein the step of oxidizing the dielectric layer comprises performing oxidation treatment on the second dielectric layer corresponding to a bottom of the groove before forming the metal gate in the groove.

13. The method for fabricating the insulating gate field effect transistor according to claim 12, wherein the oxidized second dielectric layer and the first dielectric layer compose a composite dielectric layer, to form an insulating gate structure.

* * * * *